United States Patent [19]

Watabe et al.

[11] Patent Number: 4,971,922

[45] Date of Patent: Nov. 20, 1990

[54] METHOD OF FABRICATING SEMICONDUCTOR DEVICE

[75] Inventors: Kiyoto Watabe; Satoru Kamoto, both of Hyogo, Japan

[73] Assignee: Mitsubishi Denki Kabushiki Kaisha, Tokyo, Japan

[21] Appl. No.: 358,491

[22] Filed: May 30, 1989

Related U.S. Application Data

[60] Continuation of Ser. No. 120,444, Nov. 13, 1987, abandoned, Division of Ser. No. 768,374, Aug. 22, 1985, Pat. No. 4,727,038.

[30] Foreign Application Priority Data

Aug. 22, 1984 [JP] Japan ................................. 59-176076
Mar. 4, 1985 [JP] Japan ................................. 60-43951
Apr. 18, 1985 [JP] Japan ................................. 60-83134
May 15, 1985 [JP] Japan ................................. 60-102968
May 31, 1985 [JP] Japan ................................. 60-119137
Jun. 3, 1985 [JP] Japan ................................. 60-120092

[51] Int. Cl.$^5$ ........................................ H01L 21/265
[52] U.S. Cl. ........................................ 437/44; 437/41; 437/29; 437/30; 437/233; 357/23.3; 148/DIG. 106
[58] Field of Search ................ 437/41, 44, 27, 28, 437/29, 30, 151, 233; 156/643; 357/23.3, 23.4, 59 G, 59 I, 91; 148/DIG. 105, DIG. 106, DIG. 82, DIG. 83

[56] References Cited

U.S. PATENT DOCUMENTS

| | | | |
|---|---|---|---|
| 4,488,351 | 12/1984 | Momose | 437/41 |
| 4,613,882 | 9/1986 | Pimbley et al. | 357/23.3 |
| 4,642,878 | 2/1987 | Maeda | 437/34 |
| 4,680,603 | 7/1987 | Wei et al. | 437/44 |
| 4,722,909 | 2/1988 | Parrillo et al. | 437/44 |
| 4,727,038 | 2/1988 | Watabe et al. | 437/44 |
| 4,745,086 | 5/1988 | Parrillo et al. | 437/44 |

FOREIGN PATENT DOCUMENTS

| | | | |
|---|---|---|---|
| 0200577 | 11/1983 | Japan | 437/44 |
| 0036975 | 2/1986 | Japan | 357/23.3 |
| 0101077 | 5/1986 | Japan | 156/643 |

OTHER PUBLICATIONS

Miyamoto et al., "A 1.0 μm N-Well CMOS/Bipolar Technology For VLSI Circuits", IEDM '83, pp. 63–66.

Tsang et al., "Fabrication of High-Performance LDDFETs With Oxide Sidewall-Spacer Technology", IEEE Trans. on Electron Devices, vol. ED-29, No. 4, Apr. 1982, pp. 590–596.

Bassous et al., "Self-Aligned Polysilicon Gate MOSFETs With Tailored Source and Drain Profiles", IBMTDB, vol. 22, No. 11, Apr. 1920, pp. 5146–5147.

Primary Examiner—Olik Chaudhuri
Assistant Examiner—M. Wilczewski
Attorney, Agent, or Firm—Sughrue, Mion, Zinn, Macpeak & Seas

[57] ABSTRACT

A method of fabricating a MOS field effect semiconductor device having an LLD structure is described in which an insulating film is formed on a gate electrode and a layer of polycrystalline silicon, oxide, high melting point metal or a silicide of a high melting point metal is formed on a wafer and etched away by anisotropic RIE, except a portion thereof on a sidewall of the gate. With the resulting structure, degradation of the transconductance of the device due to injection of hot carriers is prevented. Also, the size of the device can be minimized without unduly increasing the resistances of the drain/source region, the gate electrode, and the contacts of the device.

3 Claims, 16 Drawing Sheets

FIG. 10D
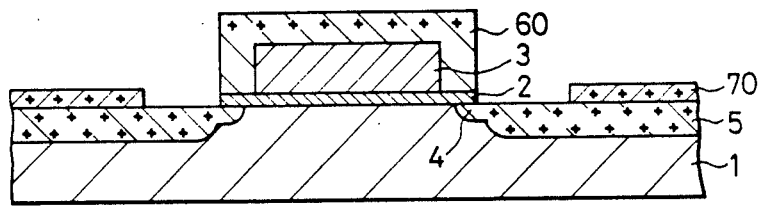
FIG. 10E
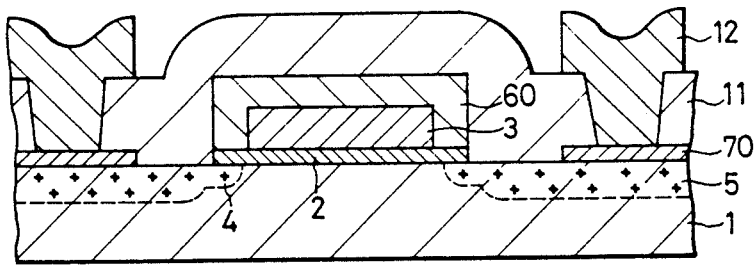

METHOD OF FABRICATING SEMICONDUCTOR DEVICE

This is a Continuation of application Ser. No. 07/120,444 filed Nov. 13, 1987, now abandoned, which is a Divisional of application Ser. No. 06/768,374 filed on Aug. 22, 1985, now U.S. Pat. No. 4,727,038.

BACKGROUND OF THE INVENTION

The present invention relates to a method of manufacturing a semiconductor device, particularly, an insulated gate (MOS) field effect semiconductor device having a lightly doped drain (referred to as LDD hereinafter) structure.

FIGS. 1A to 1C are cross sections showing main steps of a conventional manufacturing method of a semiconductor device of this type.

In FIGS. 1A to 1C, a gate insulating film 2 and a gate electrode 3 are formed on a p-type silicon substrate 1, and a low density n-type region 4 used to form a source and a drain is formed by the ion-injection of a low density n-type impurity (1) under a low acceleration voltage while using the gate electrode as a mask (FIG. 1A). The ion-injection may be performed after the insulating film 2, except a portion thereof beneath the gate electrode 3, is removed as shown in FIG. 1A. Then, as shown in FIG. 1B, an oxide film 9 is deposited using low pressure chemical vapor deposition (LPCVD). Thereafter, as shown in FIG. 1C, the oxide film 9, except a portion 10 thereof on a gate sidewall is removed by anisotropic reactive ion etching (RIE). Next a high density n-type region 5 is formed by ion injection of a high density n-type impurity (I) while using the gate electrode and the oxide portion as a mask. Thus, the LDD structure is formed.

In the conventional LDD structure, it is difficult to determine the time at which the anisotropic RIE should be terminated. That is, since the oxide portion 10 on the sidewall is used as a mask in subsequent steps, the width L of the oxide portion is very important. If its etching is not terminated properly, the width L of the oxide portion becomes variable, and sometimes even the source/drain region is etched away.

Further, if the low concentration n-type region 4 is formed by injecting, for example, phosphorous at $1 \times 10^{14}$ ions/cm$^2$ under 30 KeV, that region cannot be made amorphous. Therefore, a crystalline structure must be recovered by high temperature annealing; otherwise leakage currents may occur. Such annealing prevents the formation of shallow junctions, making minimization of the size of the device impossible.

Another problem encountered in the conventional LDD structure prepared using an oxide film portion on the gate sidewall is that hot carriers may be injected into the oxide film portion 10 during a MOSFET operation, whereupon the low concentration n-type region 4 is depleted, causing the resistance thereof to be increased, and resulting in degradation of the transconductance of the device. Further, if it is attempted to minimize the size of the device by making the junctions shallower, resistances of the drain/source region, gate electrode and contacts are increased.

SUMMARY OF THE INVENTION

Thus, an object of the invention is to provide a method of fabricating a semiconductor device by which the controllability of the width of the oxide portion on the gate sidewall is improved.

Another object of this invention is to provide a method of manufacturing a semiconductor device in which an LDD structure can be formed by a low temperature process.

Another object of this invention is to provide a method of fabricating a semiconductor device by which degradation of the transconductance and increases of the resistances of elements such as the gate electrode due to hot-carrier injection into the oxide portion on the gate sidewall are prevented.

According to the invention, the oxide portion on the sidewall of the gate is formed as follows. First, there is formed an insulating film on the gate electrode, on the substrate and on the sidewall therebetween, followed by forming a layer on the insulating film and anisotropically etching away the layer using RIE, except a portion thereof on the gate sidewall. This confromal layer may be made of polycrystalline silicon, oxide, high melting point metal, or silicides.

In the manufacturing method of a semiconductor device according to the present invention, an insulating layer is formed on a gate electrode of a gate, and a low density region of the source/drain region is formed by ion injection of an impurity using an oxide film of the gate and an insulating film on the gate as a mask. After a conductive layer is formed on a wafer, it is anisotropically etched away to leave a portion thereof on the sidewall of the gate. After the mask is removed, the high density region of the source/drain region is formed by ion injection of an impurity.

According to another embodiment of the present invention, the low density region is formed by impurity ion injection using the insulating film on the gate as a mask. Then, the oxide film is formed on the sidewall of the gate using the insulating film as a mask, and then the high density region is formed by impurity ion injection using this insulating film and the insulating film on the gate as a mask.

According to yet another embodiment of the invention, the oxide film portion on the sidewall of the gate, which is used as a portion of the mask for ion injection, is formed of a high melting point metal or a silicide of such a metal.

According to still another embodiment of the invention, a conductive layer or polycrystalline semiconductor layer is formed after formation of an insulating film on a gate electrode, which is then anisotropically etched away using RIE to form the portion on the gate sidewall.

The method of fabricating a semiconductor device according to this invention is further featured by siliciding a desired portion of the gate electrode or the gate electrode and the source/drain region in fabricating the insulated gate field effect semiconductor device having the LDD structure.

BRIEF DESCRIPTION OF THE DRAWINGS

FIGS. 1A to 1D illustrate main steps of a conventional method of fabricating a MOS field effect semiconductor device having an LDD structure;

FIG. 10A to 10E illustrate a ninth embodiment of the invention;

DESCRIPTION OF PREFERRED EMBODIMENTS

FIGS. 2A to 2D show the steps of a method of manufacturing a semiconductor device according to a first embodiment of the present invention.

Figure 1A:
Figure 1B:
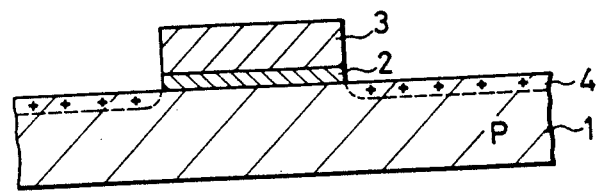
Figure 1C:
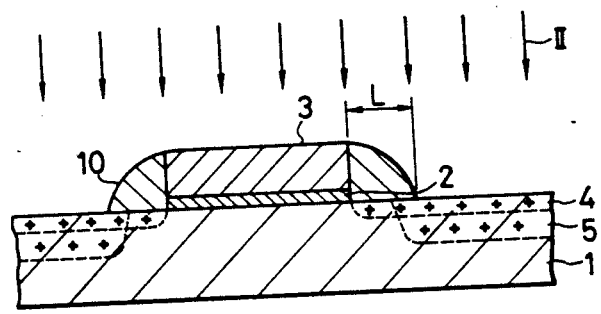
Figure 2A:
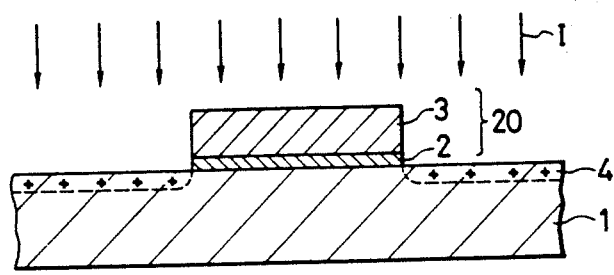
FIGS. 2A to 2D illustrate main steps of a first embodiment of the present invention.
Figure 2B:
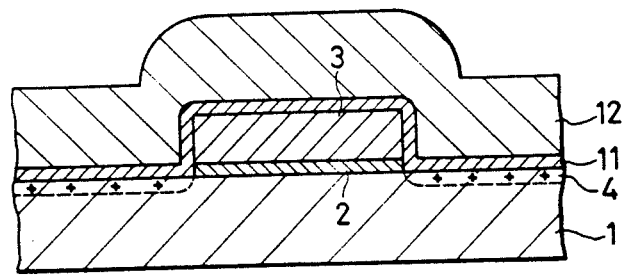
Figure 2C:
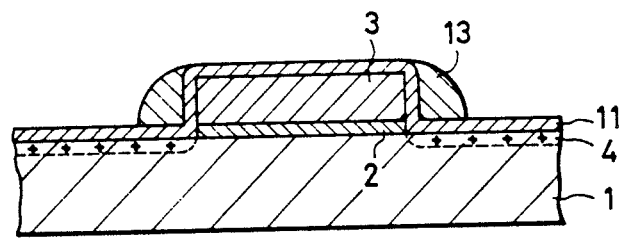
Figure 2D:
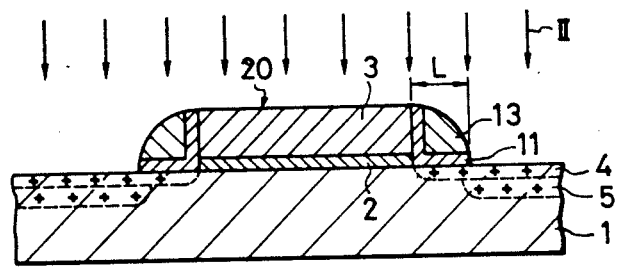

Further, reference numeral 20 depicts a gate electrode composed of a gate insulating film 2 and a polycrystalline silicon layer 3 formed on a p-type silicon substrate 1. A low density n-type region 4 is formed by injecting, for example, ions of As(I) at a density of $4 \times 10^{12}/cm^2$ under an acceleration voltage of 35 KeV while using the gate electrode 20 as a mask, as shown in FIG. 2A. An oxide film 11 is deposited on the wafer by LPCVD to a thickness of 300Å as an etching stopper, and then a polycrystalline silicon layer 12 is deposited on the oxide film 11 by LPCVD, as shown in FIG. 2B. The polycrystalline silicon layer 12 is then anisotropically etched by RIE while monitoring light emission therefrom to detect the end point of RIE, at which time polycrystalline silicon 13 is left only on the gate sidewall, as shown in FIG. 2C. Then, the etching stopper oxide film 11 is removed and the high density n-type region 5 is formed by injecting ions of As(II) at a density of $4 \times 10^{15}/cm^2$ under an acceleration voltage of 50 KeV with the gate electrode 20 and the polycrystalline silicon 13 on the gate side wall, the width of which is L, being used as a mask, resulting in an LDD structure, as shown in FIG. 2D. The device is completed by forming contact windows in the structure and adding wiring electrodes suitably.

In this embodiment, since the polycrystalline silicon 12 is formed on the oxide film 11 which is formed on the silicon surface after the ion injection step using the gate electrode 20 as a mask and is anisotropically etched by RIE, it is possible to accurately detect the end point of the etching. As a result, the controllability of the width of the polycrystalline silicon 13 on the gate sidewall is improved, and the possibility of etching away the source/drain is avoided.

In this embodiment, the width L of the polycrystalline silicon 13 on the gate side wall is determined by the thickness of the gate electrode.

Figure 3A:
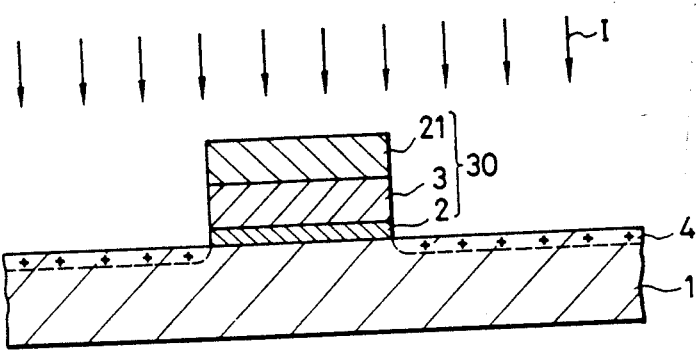
FIGS. 3A to 3C illustrate main steps of a second embodiment of the invention.
Figure 3B:
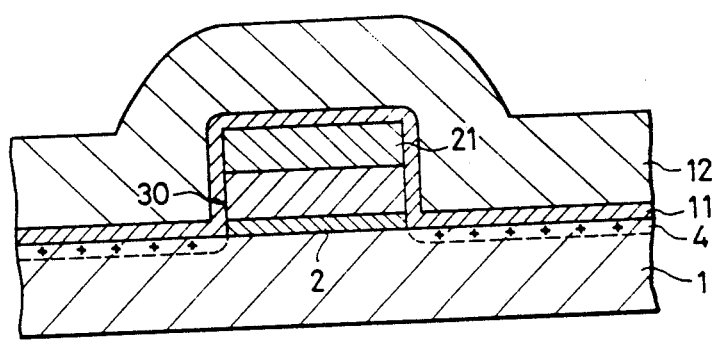
Figure 3C:
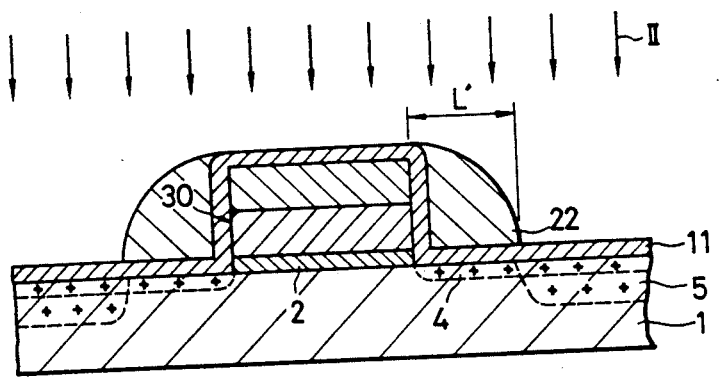

A second embodiment of the present- invention will now be described hereinafter. In FIGS. 3A to 3C, after forming a gate insulating film 2 and a polycrystalline silicon layer 3 on a p-type silicon substrate 1, a gate electrode 30 is formed by depositing an oxide film 21 by LPCV to a thickness of 0.1-0.5 microns (FIG. 3A). Subsequent steps to this are the same as those in the preceding embodiment, except that the thickness of the gate electrode is made larger than that of the corresponding structure of the preceding embodiment so that the width L' of the polycrystalline silicon portion 22 on the gate sidewall is larger than L, and ion injection of ions of phosphor (II) at a density of $4 \times 10^{12}/cm^2$ under an acceleration voltage of 35 KeV is performed through the oxide film 11. In this case, with the presence of the oxide film 11 even after phosphorous ion injection, it is possible to remove the polycrystalline silicon 22 on the sidewall by using a further step of anisotropic etching. A p-type channel insulating gate (MOS) field effect semiconductor device can be fabricated according to this embodiment by changing the conductivity types of the substrate and the impurity.

According to these embodiments, a step of forming the etching stopper composed of the oxide film and the polycrystalline silicon is employed and anisotropic RIE is performed with respect thereto. Therefore, it is easily possible to detect the end of etching and thus to control the width of the polycrystalline silicon on the gate sidewall.

Figure 4A:
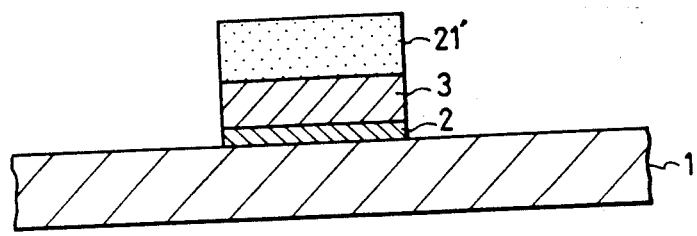
FIGS. 4A to 4C illustrate main steps of a third embodiment of the invention.
Figure 4B:
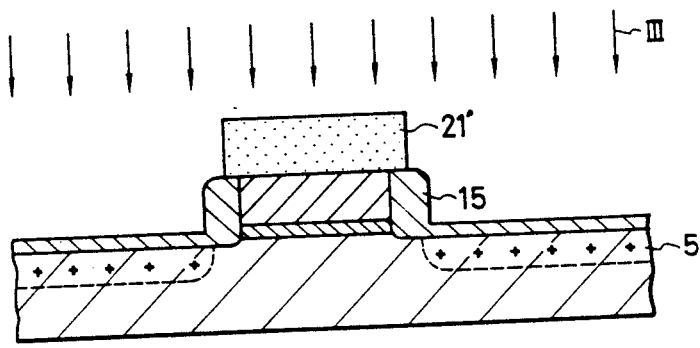
Figure 4C:
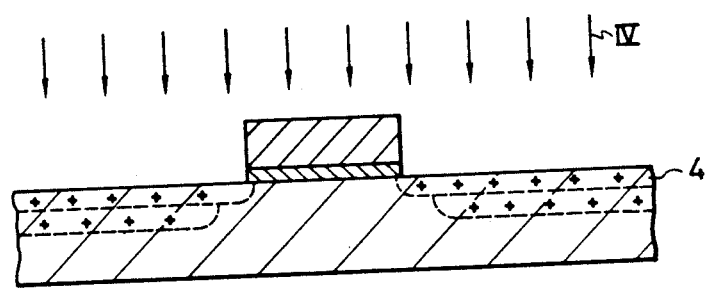

FIGS. 4A to 4C illustrate main steps of a third embodiment of the invention.

In FIG. 4A, a gate insulating film 2 and a polycrystalline silicon film 3 which serves as a gate electrode are formed on a p-type silicon substrate 1, and then an insulating film, for example, a nitride film 21', is deposited thereon by LPCVD. Next, a gate is formed by photoetching these layers. Then, as shown in FIG. 4B, a gate side wall portion of an oxide film 15 is formed by a heat treatment with the nitride film 21' used as a mask, and a high concentration region 5 of a source/drain region is formed by injecting, for example, arsenide ions (III) at ions at a density of $4 \times 10^{15}/cm^2$ while using the nitride film 14 and the gate sidewall oxide film 15 as a mask. Thereafter, as shown in FIG. 4C, the nitride film 21' and the sidewall oxide 15 are removed, and then a low concentration region 4 of the source/drain is formed by injecting, for example, phosphor ions (IV) at a density of $1 \times 10^{13}$ ions/cm², resulting in an LDD structure.

Although not shown, the device is complete-d by further forming a contact hole and the necessary wiring. If a SNOS structure (oxide film+nitride film) is employed as the gate insulating film 2, it is sufficient to oxidize the gate sidewall portion Furthermore, although the high concentration region 5 is formed prior to the formation of the low concentration region 4, these steps may be interchanged.

Figure 5A:
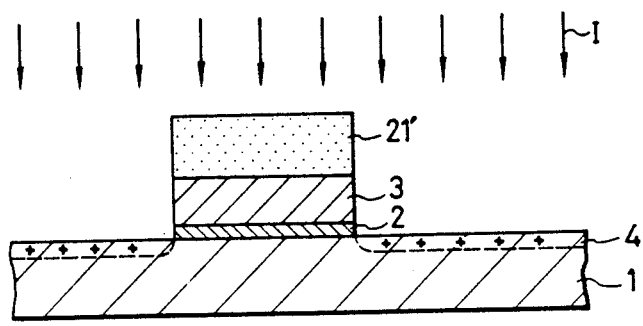
FIGS. 5A to 5C illustrate main steps of a fourth embodiment of the invention.
Figure 5B:
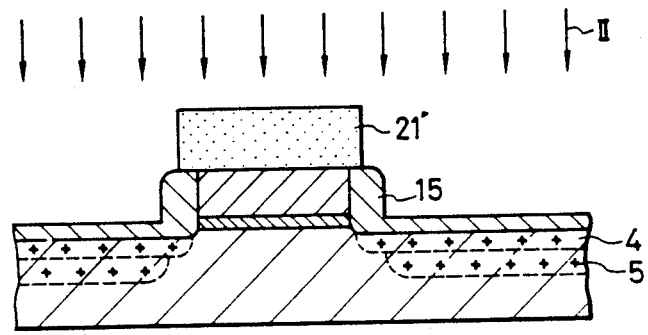
Figure 5C:
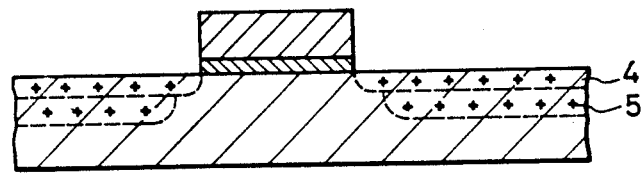

An alternative form of the embodiment described above will be described in detail with respect to FIGS. 5A to 5C. Initially, as shown in FIG. 5A, a gate composed of the gate insulating film 2 and the polycrystalline silicon film 3 is formed on a p-type silicon substrate 1 in the same manner as shown in FIG. 4A, and then a low concentration source/drain region 4 is formed by injecting an n-type impurity (I) of low concentration under a low acceleration voltage while using the nitride film 21' as a mask. Thereafter, as shown in FIG. 5B, an oxide film 15 is formed on a sidewall of the gate while using the nitride film 21' as a mask, and then the high concentration region 5 is formed by injecting an n-type impurity (II) of high concentration with the nitride film 21' and the oxide film portion 15 on the gate sidewall as a mask. After the nitride film 14 and the oxide film 15 are removed, an LDD structure as shown in FIG. 5C is obtained.

According to these embodiments, there is no need of removing the oxide film portion 15 on the gate side wall prior to ion injection, and thus there is no reduction of the thickness of the selective oxide film (SOF).

As described above, the oxide film is formed on the gate sidewall using the insulating film on the gate as a mask, the high concentration region of the source/drain is formed by injecting impurity ions using the oxide film on the gate sidewall and the insulating film on the gate as a mask, and after the oxide film on the gate side wall is removed, the low concentration region of the source/drain is formed by injecting impurity ions. According to another embodiment of the invention though, the low concentration region is formed by injecting impurity ions using the insulating film on the gate as a mask, the oxide film is formed on the gate sidewall using the insulating film on the gate as a mask, and then the high concentration region is formed by injecting impurity ions using this oxide film and the insulating film on the gate as a mask. With this arrangement, the formation of the oxide film on the gate sidewall can be controlled easily.

In this embodiment, the insulating film is formed on the gate electrode, which serves as an etching stopper for the anisotropic RIE of the conductive or polycrystalline semiconductor layer Therefore, the end point of etching can be detected accurately, and thus the width of the portion on the gate sidewall can be controlled precisely.

FIGS. 6A to 6D illustrate main steps of this embodiment of the invention.

Figure 6A:
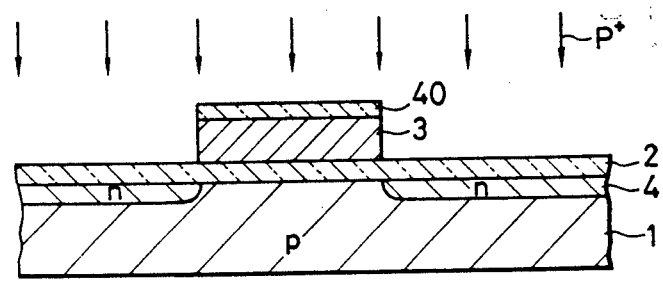
FIGS. 6A to 6D illustrate main steps of a fifth embodiment of the invention.
Figure 6B:
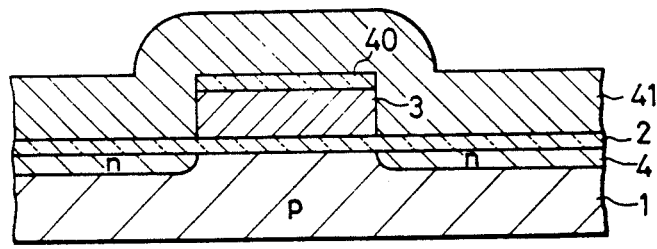
Figure 6C:
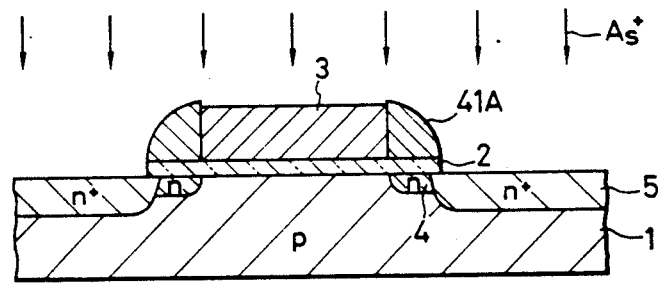
Figure 6D:
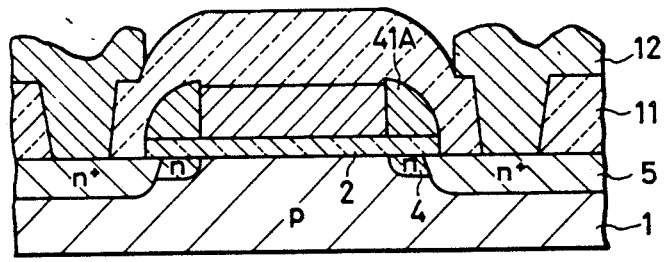

Initially, as shown in FIG. 6A, a gate insulating film 2 and a polycrystalline gate electrode 3 are formed on a p-type silicon substrate 1. Then, an insulating film 40 is deposited thereon by low pressure CVD to a thickness of 300Å. After the gate electrode 3 and the insulating film 40 thereon are desirably shaped, an n-type region 4 is formed by injecting through the film 2, for example, phosphorous ions (P+) at a density of $1 \times 10^{13}$ ions/cm$^2$ under an acceleration voltage of 60 KeV while using the shaped gate electrode 3 and the film 40 thereon as a mask. Then, as shown in FIG. 6B, a conductive layer 41, such as one made of polycrystalline silicon, is deposited by, for example, by LPCVD to a thickness of 4000Å. Thereafter, as shown in FIG. 6C, the conductive layer 41 is anisotropically etched using RIE while the light emission thereof is monitored to detect the end point of etching. Upon detection of the end point, the etching is terminated to leave a portion 41A of the conductive layer 41 on the sidewall of the gate unetched Then, after the insulating film 40 and the gate insulating film 2, which serve as etching stoppers, are removed, an n+ type region 5 is formed by injecting arsenide ions (As+) at a density of $4 \times 10^{15}$ ions/cm$^2$ under a 50 KeV acceleration voltage while using the gate electrode 3 and the conductive portion 41A as a mask, resulting in an LDD structure. Thereafter, as shown in FIG. 6D, a protective insulating film 11 and contact holes are formed and electrode wiring 12 is provided, resulting in a completed device.

Although in the above-described embodiment an n-channel MOS field effect semiconductor device is described, the invention can be made applicable to the fabrication of a p-channel MOS field effect semiconductor device simply by using an n-type substrate and p-type impurity ions.

Since the conductive layer portion on the gate sidewall is provided by forming the conductive layer on the insulating film on the gate electrode and anisotropically RIE etching it, the end point of etching can be detected easily, and the width of the conductive layer portion thus can be controlled precisely. In addition, the possibility of the etching away of the gate electrode is eliminated. It is further possible to set the width of the conductive layer portion at any value, causing the process itself to be simple, and thus making it possible to form an LDD structure in a well-controlled manner.

Figure 7A:
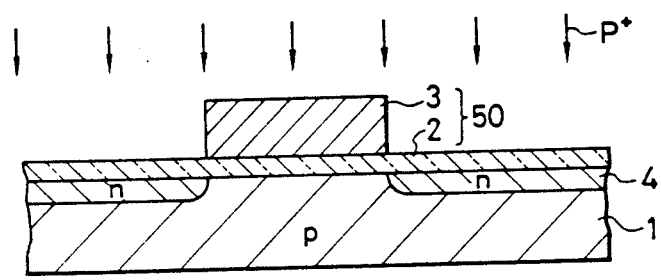
FIGS. 7A to 7D illustrate main steps of a sixth embodiment of the invention.
Figure 7B:
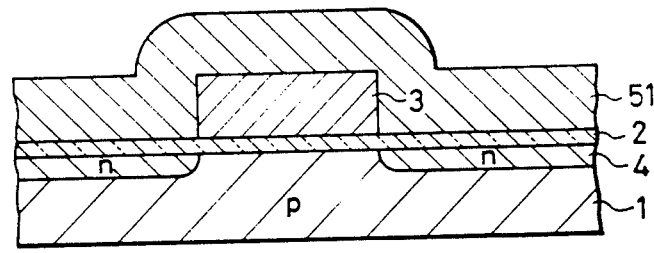
Figure 7C:
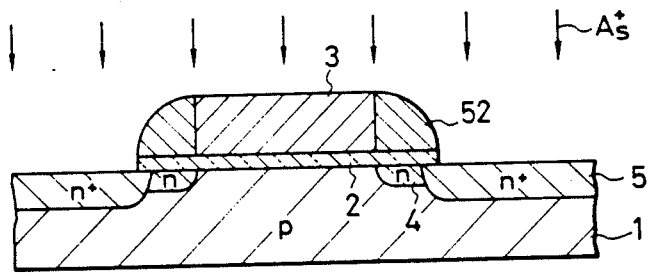
Figure 7D:
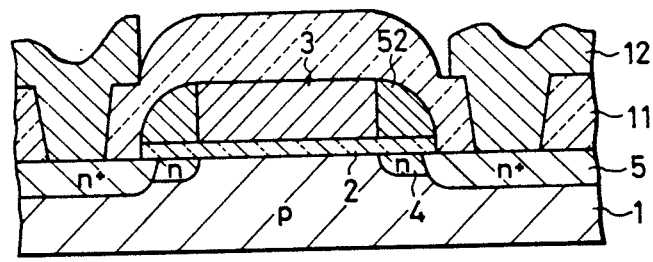

FIGS. 7A to 7D illustrate main steps of a sixth embodiment of the invention. Initially, as shown in FIG. 7A, a gate electrode layer 50 composed of a gate oxide film 2 and a polycrystalline gate electrode 3 is formed on a p-type silicon substrate 1, and then an n$^-$-type region 4 is formed by injecting, for example, phosphorous ions (P+) at a density of $1 \times 10^{13}$/cm$^2$ through the gate insulating film 2 under an acceleration voltage of 50 KeV while using the gate electrode 3 as a mask. Then, as shown in FIG. 7B, a high melting point metal such as tungsten is deposited thereon using, for example, a sputtering technique to form a tungsten layer 51 4000Å thick. Then, as shown in FIG. 7C, the tungsten layer 51, except a portion 52 thereof on the gate sidewall, is removed by anisotropic RIE, and a portion of the oxide film 2 exposed thereby is also removed. Thereafter, the n+-type region 5 is formed by injecting arsenide ions (As+) at a density of $4 \times 10^{15}$/cm$^2$ under an acceleration voltage of 50 KeV while using the gate electrode layer 50 and the tungsten portion 52 on the sidewall as a mask, resulting in an LDD structure. Then, as shown in FIG. 7D, a protective insulating film 11 is formed, in which desired contact holes are subsequently made. Upon forming electrode wiring 12, the device is completed.

Although an n-channel MOS field effect semiconductor device has been described, the invention is also applicable to the fabrication of a p-type MOS field effect semiconductor device which utilizes an n-type substrate into which p-type impurities are injected. Further, instead of the high melting point metal, a silicide of such a metal may be used.

According to this embodiment, since the gate sidewall portion is formed of a high melting point metal or a silicide of such a metal, it is possible to derive a portion of hot carriers through the gate electrode, and therefore a MOS field effect semiconductor device whose transconductance is not degraded by hot-carrier injection is obtained.

Figure 8A:
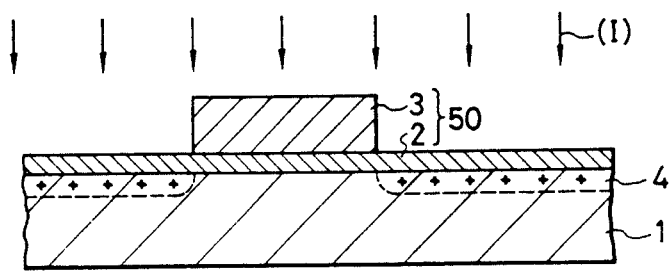
FIGS. 8A to 8E illustrate a seventh embodiment of the invention.
Figure 8B:
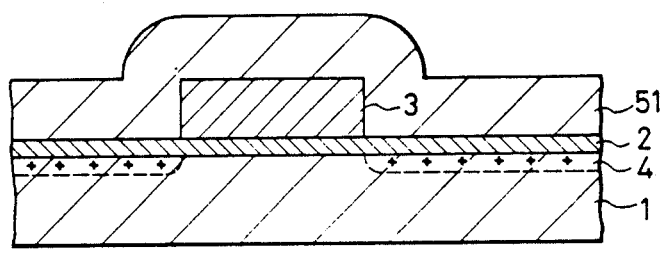
Figure 8C:
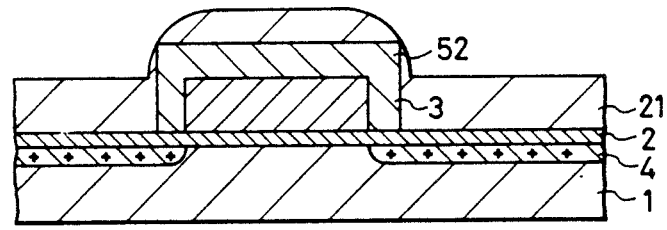

FIGS. 8A to 8C illustrate main steps of a seventh embodiment of this invention.

Figure 8D:
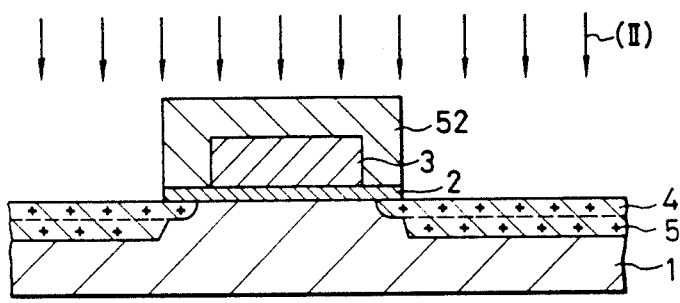
Figure 8E:
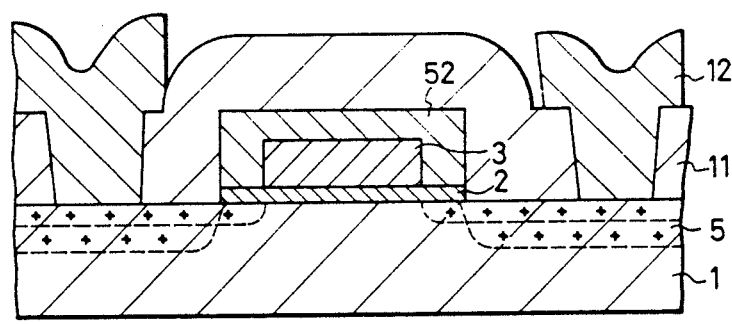

Initially, a gate electrode 50 composed-of a gate insulating film 2 and polycrystalline silicon 3 is formed on a silicon substrate 1, and then a low concentration n-type region 4 is formed by injecting, for example, p ions (I) at a rate of $1 \times 10^{13}$ ions/cm$^2$ through the gate insulating film 2 under an acceleration voltage of 50 KeV while using the gate electrode 50 as a mask (FIG. 8A). Then, a Pt layer 51 is deposited on the silicon substrate 1 to a thickness of 2000Å by sputtering (FIG. 8B). Thereafter, the substrate is heat-treated to silicide the polycrystalline silicon 3 (FIG. 8C) into a silicide region 52. The Pt layer 51 and the gate insulating film 2 are removed, and then after As (II) ion injection at $4 \times 10^{15}$ ions/cm$^2$ under an acceleration voltage of 50 KeV while using the silicide region 52 of the gate electrode as a mask, the substrate is heat-treated to form the high concentration n-type region 5, resulting in the LDD structure (FIG. 8D). Finally, a contact hole is formed in the region 5, and wiring is performed therethrough, resulting in a completed device (FIG. 8E).

In this embodiment, the sidewall portion of the gate electrode also acts as the gate electrode so that hot carriers can be derived from the gate electrode, preventing the transconductance from being lowered.

Also in this embodiment, the LDD structure includes the silicided gate electrode 52.

Another embodiment in which both the gate electrode 20 and the source/drain are silicided will be described hereinafter. FIGS. 9A to 9E illustrate main steps of an eighth embodiment of the inventive method in which this is effected.

Figure 9A:
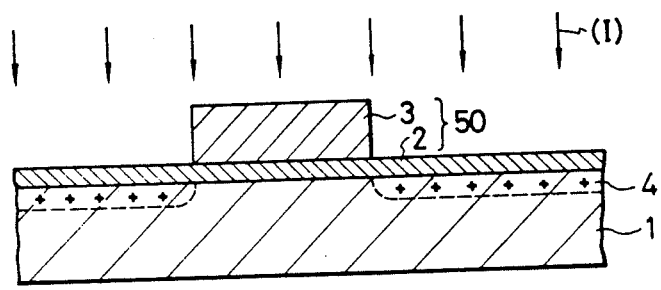
FIGS. 9A to 9E illustrate an eighth embodiment of the invention.
Figure 9B:
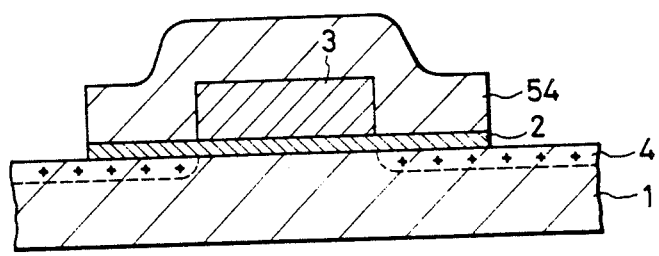
Figure 9C:
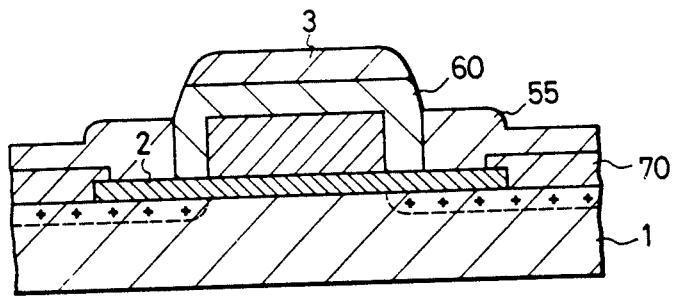
Figure 9D:
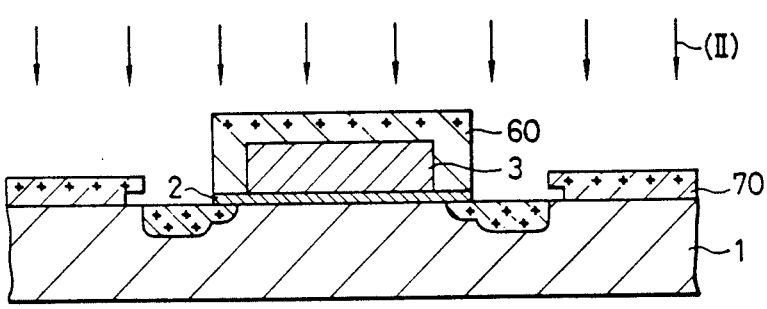
Figure 9E:
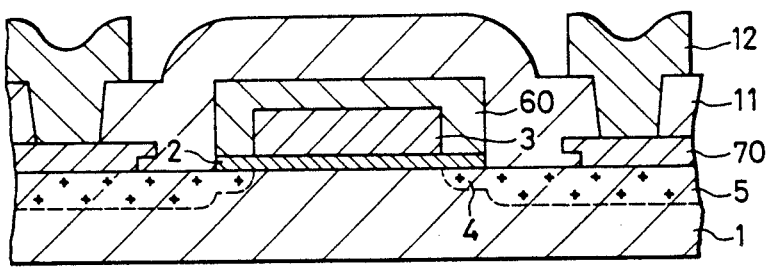

The step shown in FIG. 9A is the same as in the case of FIG. 8A. After this step, a resist film 54 is formed on the silicon substrate 1, and a portion of the gate insulating film 2 and a desired region of the source/drain is removed using the resist film 54 as a mask (FIG. 9B). After the resist film 54 is removed, a high melting point metal 55 such as titanium is deposited to a thickness of 2000Å by sputtering. After the source/drain region is silicided to obtain silicided regions 60 and 70 (FIG. 9C), the high melting point metal (which is not silicided) and the gate insulating film 2 are removed. Thereafter, the high concentration region 5 of the source/drain is formed by injecting, for example, As at $4 \times 10^{15}$ ions/cm$^2$ under 50 KeV, resulting in an LDD structure (FIG. 9D). Thereafter, following heat treatment, contact holes are formed, and wiring is effected therethrough, resulting in a completed device (FIG. 9E).

In this embodiment, it is possible, in addition to the effects obtained in the above-described embodiments, to reduce the sheet resistance of the source/drain region in which the metal is silicided. However, if the high melting point metal 55 around the source/drain area and the gate electrode is silicided by heat treatment for a considerable time, the metal can become over-silicided, causing a short-circuit between the gate electrode and the source/drain.

FIGS. 10A to 10E illustrate main steps of another embodiment of the invention in which this problem is eliminated.

Figure 10A:
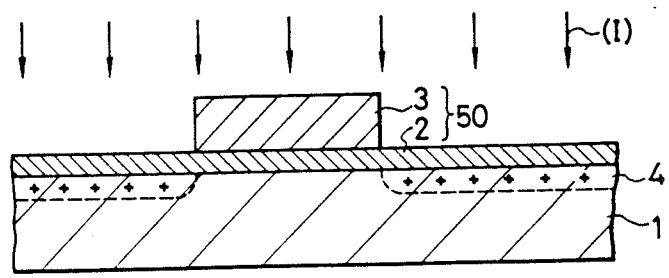
Figure 10B:
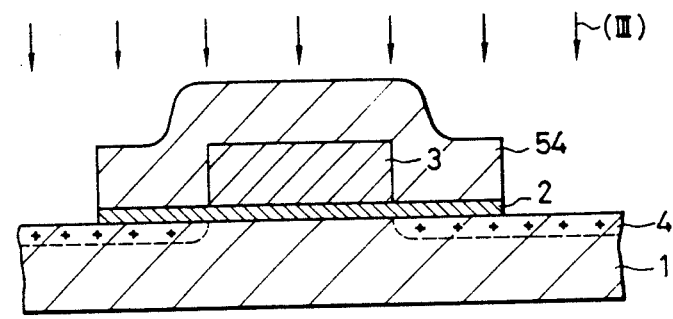
Figure 10C:
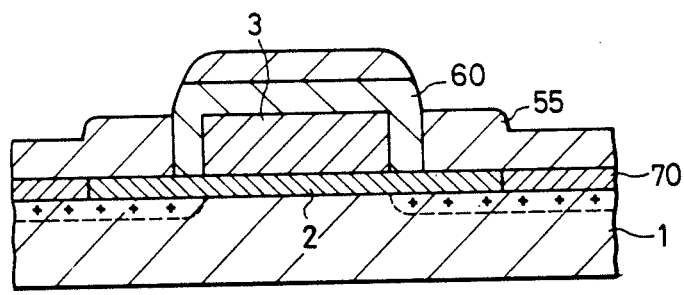

FIG. 10A is the same as the FIG. 9A. After this step, a resist film 54 is formed on the silicon substrate 1, and, while using the resist film 54 as a mask, a portion of the gate insulating film 2 in a desired region of the source-drain is removed. Then, As (III) is injected at a rate of $4 \times 10^{15}$ ions/cm$^2$ under 30 KeV (FIG. 10B). After the resist film 54 is removed, a high melting point metal 55 such as molybdenum is deposited by sputtering to thickness of 2000Å. Thereafter, a heat treatment is performed. Since the impurity concentration of the source/drain region to be silicided is high, the silicidation reaction rate is reduced in the heat treatment, and hence the resulting silicide does not cause a short-circuit between the gate electrode and the source/drain (FIG. 10C). Thereafter, the molybdenum layer 55 (which is not silicided) is removed, and As (II) is injected at $4 \times 10^{15}$ ions/cm$^2$ under 50 KeV to obtain an LDD structure (FIG. 10D). Finally, the substrate is heat-treated, and, after wiring through contact holes, the device is completed (FIG. 10E).

In this embodiment, the high melting point metal is deposited by sputtering. Therefore, because the metal is deposited unavoidably over the entire surface of the silicon substrate, the portion thereof not silicided has to be removed in a separate step.

FIGS. 11A to 11F illustrate main steps of an embodiment in which the removal step of the high melting point metal is eliminated.

Figure 11A:
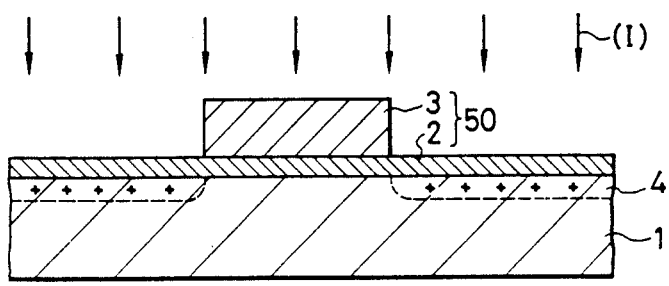
FIGS. 11A to 11F illustrate a tenth embodiment of the invention.
Figure 11B:
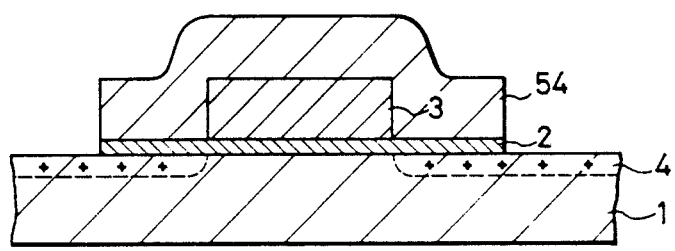
Figure 11C:
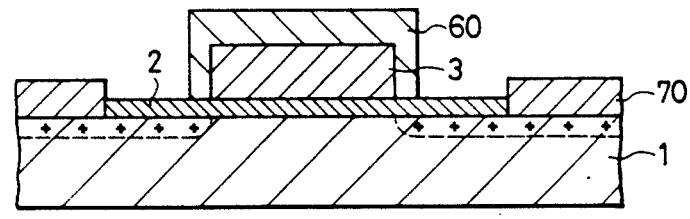
Figure 11D:
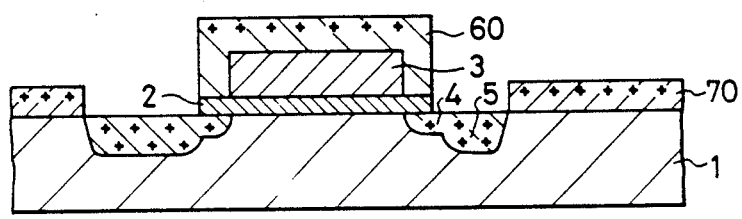
Figure 11E:
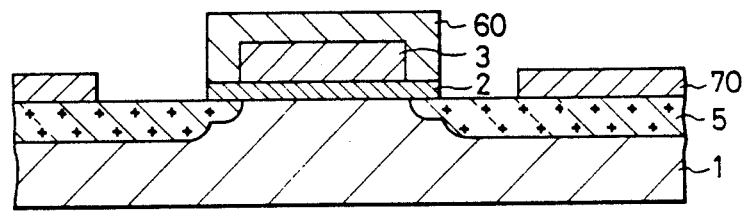
Figure 11F:
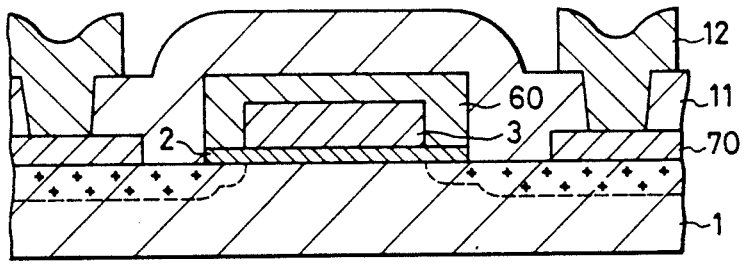

FIGS. 11A and 11B are the same as FIGS. 9A and 9B, respectively. After the step shown in FIG. 11B, the resist film 54 is removed, and then a tungsten silicide layer is formed preferably on the source/drain region, except a portion hereof beneath the gate insulating film and on the gate electrode, by LPCVD deposition of tungsten (FIG. 11C). Thereafter, the gate insulating film is removed, and then As (II) is injected at $4 \times 10^{15}$ ions/cm$^2$ under 50 KeV, resulting in a LDD structure (FIG. 11D). Then, a heat treatment is performed (FIG. 11E) and a contact hole is formed. After wiring, the device is completed (FIG. 11E). Thus, according to this embodiment, the step of removing the portion of the high melting point metal which is not silicided becomes unnecessary.

Although n-channel insulated gate (MOS) semiconductor devices are described with reference to the above embodiments, the invention can also be made applicable to the manufacture of p-channel insulated gated (MOS) field effect semiconductor devices by using an n-type substrate and injecting a p-type impurity thereinto.

According to the inventive method, the gate sidewall portion and/or the source/drain region is silicided. Therefore, because the sidewall portion acts as a portion of the gate electrode through which hot carriers are derived, a reduction of the transconductance of the device is prevented, and the sheet resistance of the source/drain region (which is silicided) is reduced.

FIGS. 12A to 12D illustrate main steps of still another embodiment of the invention.

Figure 12A:
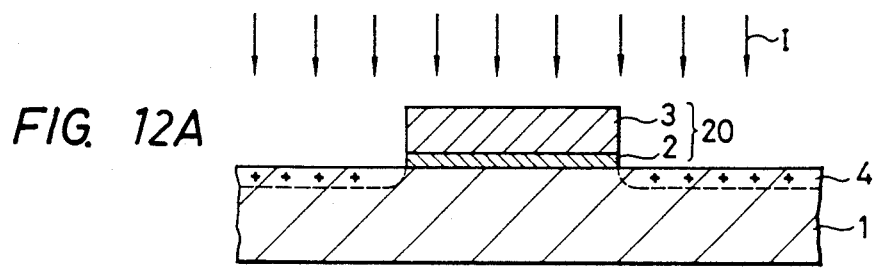
FIGS. 12A to 12D illustrate an eleventh embodiment of the invention.
Figure 12B:
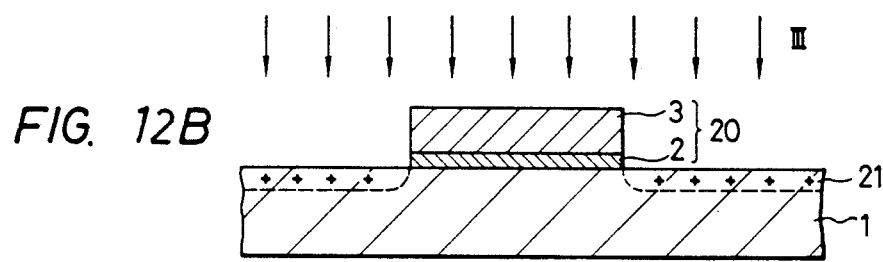
Figure 12C:
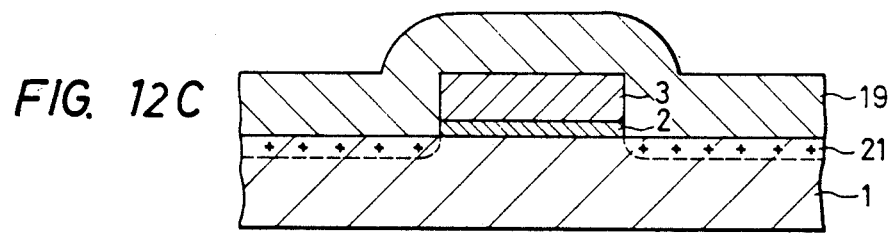
Figure 12D:
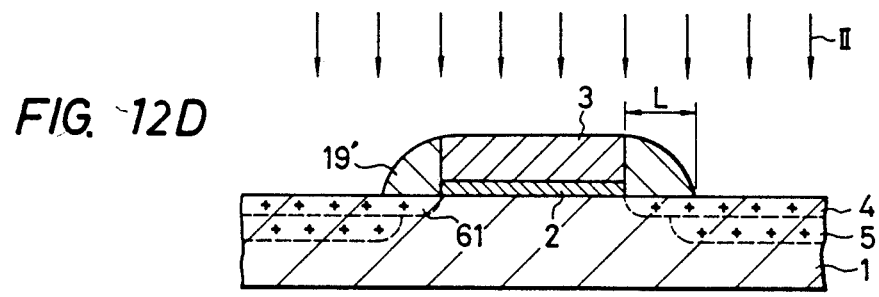

As shown in FIG. 12A, a gate electrode 20 is formed on a p-type silicon substrate 1. Then, a low concentration n-type region 4 is formed by injecting, for example, P+ ions (I) at $1 \times 10^{14}$ ions/cm$^2$ under an acceleration voltage of 30 KeV while using the gate electrode 20 as a mask. Thereafter, as shown in FIG. 12B, the region 4 is made amorphous by injecting silicon ions (III) at about $1 \times 10^{15}$ ions/cm$^2$ under an acceleration voltage of 30 KeV to obtain an amorphous region 61. Then, as shown in FIG. 12C, an oxide film 19 is deposited by LPCVD. Thereafter, as shown in FIG. 12D, the oxide film 19, except a portion 19' thereof on a side wall of the gate electrode 20, is removed by anisotropic etching. Then, a high concentration n-type region 5 is formed by injecting, for example, As+ ions at $4 \times 10^{15}$ ions/cm$^2$ under 50 KeV while using the gate electrode 20 and the oxide film portion 19' as a mask, resulting in a LDD structure. Then, the source/drain region is activated by a low temperature annealing process such as rapid annealing, and, after contact holes are made and wiring therethrough effected, the device is completed.

Although in the above embodiment the present invention has been described with respect to and n-channel insulated gate (MOS) field effect semiconductor device, the invention is applicable also to a p-channel insulated gate (MOS) field effect semiconductor device using an n-type substrate and p-type impurity ions.

Although the source/drain region in the above embodiment is made amorphous by silicon ion injection, it is possible to use instead of silicon ions an inert gas ion such as He, Ne, Ar, Kr, Xe or Rn.

According to this embodiment, because the low concentration n-type source-drain region is made amorphous by ion injection of silicon inert gas, crystallization can be restored by rapid annealing or low temperature annealing, and thus shallow injection can be realized easily, which is effective in minimizing the size of the device.

We claim:

1. A method of manufacturing a semiconductor device comprising the steps of:

forming a gate insulating film on a silicon substrate having a first conductivity type and forming, on a desired portion of said gate insulating film, a gate electrode having a bottom surface contacting said gate insulating film and a top surface opposite said bottom surface;

forming an insulating film on said top surface of said gate electrode;

forming a low impurity concentration source/drain region by injecting impurity ions having a second conductivity type in a surface portion of said silicon substrate while using said gate electrode, having thereon said insulating film, as a mask;

forming a conductive layer on said insulating film positioned on said top surface of said gate electrode, and on said gate insulating film, except a portion thereof positioned beneath said gate electrode, and in contact with a sidewall of said gate electrode;

anisotropically etching said conductive layer to leave a portion thereof on only said sidewall of said gate electrode;

forming a high impurity concentration region in said source/drain region by injecting impurity ions of said second conductivity type while using said gate electrode and said conductive layer portion on said sidewall of said gate electrode as a mask;

then forming a protective insulating layer over said portion of said gate insulating film, over said gate electrode, over said conductive layer portion, and over said high impurity concentration region; and forming contact holes through said protective insulating layer.

2. The method as a claimed in claim 1, wherein said conductive layer is made of polycrystalline silicon.

3. A method of forming a semiconductor device, comprising the steps of:

forming, on a silicon substrate, a gate insulating film and a polycrystalline gate electrode;

forming an etch stop layer on said gate electrode;

forming a source/drain region by ion injection of an impurity of a different conductivity type from that of said substrate into the latter while using said electrode as a mask;

depositing a polycrystalline silicon layer overlying said electrode and said source/drain region, and in contact with sidewalls of said electrode;

removing said polycrystalline silicon layer, except for a portion adjacent a sidewall of said gate electrode by anisotropic etching, thereby forming an unetched polycrystalline silicon sidewall portion;

forming a high density impurity region of said source/drain region by ion injection of an impurity having a different conductivity type from that of said substrate while using said gate electrode and said unetched polycrystalline silicon sidewall portion as a mask;

forming a protective insulating layer overlying said gate electrode and said unetched polycrystalline silicon sidewall portion; and forming contact holes through said protective insulating layer.

* * * * *